United States Patent [19]
Van Millingen et al.

[11] 4,020,685
[45] May 3, 1977

[54] PHASEMETERS

[75] Inventors: Reuel Duncan Van Millingen, Ravensthorpe; Robert Terence Portus, Ashby-de-la-Zouch, both of England

[73] Assignee: Torquemeters Limited, Ravensthorpe, England

[22] Filed: May 27, 1975

[21] Appl. No.: 580,739

[30] Foreign Application Priority Data
May 29, 1974 United Kingdom ............. 23743/74

[52] U.S. Cl. ............................. 73/136 A; 324/83 D
[51] Int. Cl.$^2$ ......................................... G01L 3/10
[58] Field of Search ............... 73/136 A; 324/83 D, 324/140 D; 235/92 PS

[56] References Cited
UNITED STATES PATENTS

| | | | |
|---|---|---|---|
| 3,640,131 | 2/1972 | Turk | 73/136 A |
| 3,906,361 | 9/1975 | Nessler et al. | 324/83 D |

*Primary Examiner*—Charles A. Ruehl
*Attorney, Agent, or Firm*—William F. Frank

[57] ABSTRACT

The invention relates to a phasemeter, particularly for torque measurement, using trigger devices to convert phase related input analogue signals to digital signals the mark space ratio of which is a measure of phase displacement between the input signals, and uses a technique of attenuating an input signal, until no change in mark space ratio of the digital output is produced, for ensuring that the triggers trigger at the same level, and also provides for complementation of the trigger outputs as a check on the operation of the triggers.

20 Claims, 8 Drawing Figures

PHASEMETERS

This invention relates to apparatus and methods for measuring the difference in phase between two alternating current waveforms such as may be generated for example by certain types of transmission dynamometers, hereinafter referred to as torquemeters, the phase difference being a measure of a torque sensed by such a torquemeter. The invention also relates to such torquemeters when provided with the apparatus and/or when the methods to be described herein are used in conjunction therewith in order to determine the transmitted torque.

Torquemeters have been proposed, such as for example in British Pat. No. 1,265,500, wherein a rotor comprising a toothed wheel (like a spur gear) of magnetic material is situated at each end of a shaft-like member of calibrated or known torsional stiffness, each rotor being co-axial with and fastened to the member so as to rotate therewith. The rotors are generally so aligned that, when torsional forces are absent in the member, the teeth of one rotor have zero angular displacement relative to those of the other rotor. Associated with each rotor is a stationary electro-magnetic transducer such that, when the rotors rotate, a substantially sinusoidal electrical signal is generated in each transducer, each signal being of the same frequency and, in a no-torque condition, having substantially the same phase relationship. (In practice slight phase displacements may exist at zero torque due to mechanical imperfections). In practice, phasemeters have difficulty in distinguishing between phase differences of 0° and 360°, the teeth therefore may be given a small angular displacement in the zero torque condition, of say 10 electrical degrees, and a corresponding correction made to the indicated torque. An alternative method is to temporarily invert one of the input signals. As torque is applied to the rotating member, one rotor becomes angularly displaced relative to the other, and correspondingly the phase of one transducer signal shifts relative to the other by an amount which is proportional to the torque.

It is also known to incorporate a rotatable toothed magnetic member co-axial with the rotor (as described in Japanese patent publication Nos. 44-6960 (1969) and 45-17999(1970)) whereby transmitted torque may be determined when the rotor is stationary.

The waveform of each signal is rarely if ever of pure sinusoidal form, neither are the amplitudes of the signals identical. Furthermore various slight asymmetries of the rotors and stators may give rise to amplitude or phase modulation of one or both signals, and there may be other sources of noise which adversely affect the signal waveforms.

Measurement of the phase relationship between the two signals becomes more difficult and more susceptible to error when the signal waveforms are distorted, and it is therefor an aim of the invention to provide both apparatus and method which permit accurate determination of a phase relationship, even when such signal distortion is present. The invention further aims to provide means for determining whether or not errors in phase measurement do occur.

Methods and apparatus have been proposed for measuring the phase relationship between two harmonic signals using both analogue/digital and analogue/analogue techniques, the invention relating in part to improvements in such methods. For example, in "Digital Instruments" by K. J. Dean, published by Chapman & Hall 1965, pages 155-6, an analogue/digital method is disclosed which comprises feeding each signal into a corresponding Schmitt or similar trigger device each of which devices produces an output pulse each time the voltage amplitude of the input waveform passes through zero on a rising voltage. The two trigger outputs are fed into the "set" and "reset" inputs respectively of a bistable circuit, thus producing a square waveform output signal the mark-space ratio of which is a measure of the phase difference. In order to determine this ratio, a train of high frequency clock pulses is gated into a series of decade counters each time the bistable circuit output assumes one of its two possible states. Simultaneously, the same train of clock pulses is counted by a second and separate series of decade dividers which, when a predetermined number of pulses is reached, causes the total count of the first series of decade counters to be visually displayed and/or recorded, and then causes both series to be cleared so that a fresh count may commence. The period of divider operation is the standard count-period. The magnitude of the first count is a measure of the phase difference but, so that a direct reading may be obtained, ten to the power of a whole number is normally chosen for the predetermined count of the second counter series. Say, for example, the first counter series is stopped every $10^6$ clock train pulses, and the phase difference (and hence the bistable output mark-space ratio) is 25%, then the visual display will read 250000. All that is required for direct readout is the inclusion of a decimal point.

Still considering the above example, if the frequency of the clock train of pulses is 1MHz, then a fresh count and display of phase difference will occur every second.

The phase difference (i.e. angular displacement of the input signals) is therefore given by:

$$100 \times \frac{\text{TOTAL COUNT}}{N} = \text{Phase difference \%,}$$

where $N =$ number of pulses required to fill the divider series.

There are a number of difficulties inherent in the method just described and which the invention seeks to resolve, these being:
1. It is difficult to set both the input trigger devices to operate exactly at the desired trigger voltage. An error in setting one such device will introduce an error in the readout.
2. Should the frequency of the two input signals from the transducers coincide with a sub-multiple of the clock frequency, especially at high rates of information (i.e. high frequency signal inputs), then one clock train pulse may escape a count each time the gate closes to the first counter series.
3. At low information rates, i.e. low input signal frequency, the ratio of $$\text{the ratio of } \frac{\text{TOTAL COUNT}}{N} = \text{phase difference}$$

is the only valid when the divider series both starts and arrests the count at the same instant in respective signals, for instance, the end of a space state. The chance of such coincidence ocurring with every count is negligible.

4. Input signal distortion may fire either of the trigger devices at the incorrect moment in time.

The invention accordingly contemplates one or any combination of the following methods which seek to alleviate the aforesaid difficulties:

1. The amplitude of one of the input signals is repeatedly reduced relative to the other and the setting of one or both trigger devices adjusted until such reduction in amplitude results in little or no change in readout. When the triggers are both operating at the precise cross-over point, variation in amplitude of either signal will not affect the readout.
2. Having performed method No. 1, there may still be residual inaccuracies due to such factors e.g. as unequal transducer impedances, giving rise to non-identical waveforms. This further method therefore comprises the step of reversing the input signals so that the readout should then be the complement of the original readout. One or both trigger devices may then be adjusted until a true complement is attained.
3. A method of reducing inaccuracies which can occur when the frequency of the input signal is a submultiple of the clock frequency, is to angle modulate, phase modulate or frequency modulate either the clock frequency or the frequency of the input signals. In the first case, this may take the form of applying an alternating or pulsed voltage of low frequency to modulate the output train of clock pulses. In similar manner, the set point of the input trigger devices may be modulated, the clock train of pulses remaining unmodulated.

It is preferable that any such modulation be random, but in practice it has been found that this is unnecessary. Hereinafter, all such forms of modulation will be referred to as frequency modulation.

4. A variation of method 1, which helps to overcome the problem of input signal waveform distortion is to permit the input Schmitt triggers to operate on either positive or negative crossovers, or on the average of the two, further including after each operation a delay which prevents further triggering. The delay, which may be achieved by known means, must be less than $\frac{1}{2}f$ where $f$ is the maximum frequency the input signal may assume.

A method of maintaining accurate readings when low information rates exist is to start the count period at a first bistable state change in a selected sense and to terminate the count period after an integral number of Mark-Space periods i,e. at a second change of the said bistable state in the same said selected sense: accordingly:-

A first counter is provided arranged to count clock pulses gated to pass only during the Mark states of the bistable. A second counter is provided arranged to count the total number of clock pulses generated during the count-period. The ratio of the count of the first counter to that of the second then provides a measure of the mark-space ratio. The said ratio may conveniently be calculated by directing the outputs of the two counters into a programmed calculator.

The count period may be determined approximately by a divider series responsive to a predetermined number of clock pulses or Mark-Space signals from the bistable; these methods are however given by way of example and are not to be construed as limiting.

Of the above methods 1 and 2 may be employed in an analogue type of phasemeter, included in the invention, in which the output of a bistable circuit, operated as before-described, by the pulses from the two input trigger devices, is continuously integrated by, for example, a resistance-capacity network to give an analogue voltage representation of the Mark-Space ratio of the output and therefore a measure of the phase difference between the input signals. Methods 1 to 4 may be employed when the integration is by digital means; for example, integration by means of the "up-down" counter fed with clock train pulses, gated as before by the bistable output, to give an "up" count. The output of the counter passes through a decimal rate multiplier (DRM) which also receives a train of clock pulses 180° out of phase with the first mentioned clock pulse train, the output of the DRM passing to the up-down counter to give a "down" count. This arrangement behaves in the manner of a simple series resistor/parallel capacitor integrator to give a continuous output from the counter which, after decoding, may be displayed by known means.

In order to perform one or more of the methods described herein, the invention accordingly provides a phasemeter for determining the relative angular displacement of two harmonic signal waves derived from electromagnetic transducers comprising: two trigger devices each for receiving a respective said signal wave and which produce an output pulse each time the respective signal wave passes through zero voltage in at least one sense of direction; trigger adjustment means for setting the voltage at which each said device triggers; a bistable which in operation has first and second stable output states and which receives to output of each trigger device in such manner that it produces a square wave output the Mark-Space ratio of which is directly related to the relative angular displacement of said two harmonic signal waves; measuring apparatus which receives said bistable square wave output, measures the Mark-Space ratio thereof and produces an output indicative of said relative angular displacement; in which further means are provided for determining each said trigger device set-point comprising, attenuator means for selectively and respectively attennating said signal waves, and switch means for reversing the inputs to said trigger devices.

Further in accordance with the invention, the measuring apparatus may be digital and comprise: a generator of high frequency clock pulses; a first series of decade counters; a gate controlled by said bistable output so that said clock pulses are passed to said first counters only when said bistable output assumes a first state; a divider which receives directly said clock pulses and produces an output pulse each time the number of received clock pulses reaches a predetermined number, thus determining a standard count-time; visual display means which operate to indicate the total count of said first counters each time said divider produces an output pulse, delay means which receive and delay said divider output pulse which is then directed thereby to reset said first counters and said divider. Furthermore, means may be provided for frequency modulating the output from the generator of clock pulses.

The digital measuring apparatus may, in accordance with the invention, include a logic circuit which, if such divider pulse is not coincident with said bistable output change to its first state, extends the count-time until said bistable output next changes to its first state; a second series of decade counters which receive directly said clock pulses and record a count thereof during said standard count-time and extension thereof, and produces a correction factor.

In another aspect of the invention the phasemeter may comprise: one or more data input means; one or more instruction input means; a scanner which periodically scans said data input means, said instruction input means and said first and second counter outputs, in a predetermined sequence; a calculator module which receives the sequence of data and instruction and performs calculation in accordance with said instructions; a visual display which displays the calculation results. When such a phasemeter is incorporated in a torquemeter, the data supplied to the scanner may include correction factors such as, for example, zero torque displacement, calibration constants, and, should direct readings of transmitted horsepower be required, the data can include shaft speed. The instructions merely tell the calculator module what to do with the supplied information, for example, multiply torque by shaft speed or divide the first decade counter total by the count produced by the second decade counter to give a more accurate measure of phase displacement, and so on.

A further feature of the invention aims to compensate for errors in the phase shift signal produced by the transducer system comprising a toothed wheel and electromagnetic pickups, and in particular systems in which a number of pickups are used the output of which is summed electrically for example by connecting them in series in order to provide first order compensation for the effect of eccentricity of, for example, one end and one toothed ring only of the rotating assembly relative to its associated pickup system. Particular forms of multipole pickup have been described in British Pat. Nos. 1,265,500 and 1,201,370 which generally have the same number of teeth as its associated rotating toothed disc.

It has been observed that relative radial displacement between the rotor and its associated multipole stator results in small second order phase displacements of the signals from it which are probably due to a corresponding change in the inductance and general electromagnetic characteristics of the signal generating system. These false changes in the phase angle of the train of signal waves cause a corresponding small change in the reading of the phase meter when the eccentricity between rotor and stator is different at the two ends of the shaft for example when the axis of the stator assembly is slightly angled in relation to that of the rotating assembly.

Such errors are small and it has been observed that an approximate linear relation exists between such errors in reading and the differences of amplitude between the signals from the two ends of the system.

According to this feature of the invention it is proposed to use this difference of signal amplitude as a controlling signal which applies a corresponding empirically determined correction to the reading.

This correction may be applied in various ways, three of which are outlined below by way of example but are not in any sense limiting:

a. The signal amplitude difference or ratio, hereinafter called the controlling signal, may be used to introduce progressively additional inductance capacitance and resistance separately or together in one of the output circuits so as to compensate directly the phase displacement resulting from relative angular displacement between the rotor and stator.

b. The controlling signal may be used to bias one or both of the zero volt crossover detectors of the phasemeter with appropriate arrangements whereby the reading plus complement feature already described remains effective at all times.

c. The controlling signal may be used to apply corrections which vary the effective width of the mark-space signal.

d. When the torquemeter or phasemeter is used in conjunction with a computer or other form of calculator which processes information from the torquemeter to give corrected values of torque and/or horsepower, the controlling signal may be fed direct to the computer and processed as part of the corrective data.

This compensation in response to the controlling signal may be applied to either or both outputs from the transducer as may be convenient.

Another feature the invention seeks to overcome is ambiguity of reading when the two trains of signal waves are nearly in phase. In these circumstances the readout changes abruptly from 100% phase displacement to zero phase displacement, and in cases where torsional vibration exists sufficient to cause more than 100% signal phase displacement for part of the time, the readings of the phase meter may be unreliable since they represent a mixed sample. This problem may be overcome by the method of inverting one train of signal waves and at the same time adding 50% to the phase displacement displayed, which method is an aspect of the invention.

Inversion of the signal or its equivalent may be produced in various ways of which the following are quoted by way of example only:

a. The AC signal may be inverted by using a simple crossover switch.

b. In systems where the pickups are magnetised by applying a DC voltage the sense of this polarising current may be reversed.

c. Where in normal operation the zero volt crossover detector is arranged to trigger on the rising part of the signal voltage the signal may be diverted to operate a second independent zero volt detector designed to trigger at zero volts on the descending part of the signal wave.

A desirable associated feature of any such system is the provision of independent biasing resistors or other setting-up means as previously described whereby crossing over the two input signals from the transducer can be made to produce the exact complement of the normal reading.

This phase inversion system may be arranged for manual operation or it may be switched in electronically whenever the reading of the phasemeter approaches zero or 100%.

Apart from avoiding the possibility of false readings when operating close to zero and 100% phase displacement, this phase inversion system permits continuous reading over phase displacements through an unlimited number of tooth pitches and by the addition of relatively coarse means of measuring the number of whole tooth pitches of relative angular displacement, the system provides a means of measuring relative angular displacements of 360 mechanical degrees or more to an extremely high accuracy and with a continuous display.

While the invention is primarily intended for measuring relatively small angular displacements of a rotating torsion shaft, its use is not confined to this particular application and may be extended to cover a wide range of general measuring and control applications.

Methods and apparatus in accordance with the invention will now be exemplified with reference to the accompanying drawings which are as follows.

Figure 1:
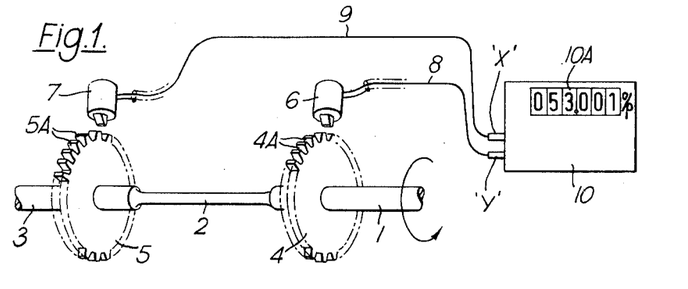
FIG. 1 shows schematically a torquemeter connected to a phasemeter.

Referring to FIG. 1, the torquemeter comprises a driven shaft 1 for connection to a prime mover, such as a gas turbine for example, an output shaft 3 for connection to whatever is to be driven by the prime mover, shafts 1 and 3 being interconnected by a torsionally resilient member 2 whereby torque is transmitted from one shaft to the other. Member 2 is of known torsional stiffness so that by measuring the angle of twist thereof, the torque transmitted thereby may be determined.

In order to determine the angle of twist of member 2, toothed rotors 4 and 5 of magnetic material are provided at each end of the member, being fixed thereto so that, in a no-torque condition, teeth 4A and 5A are angularly aligned. Should member 2 twist, teeth 4A will be angularly displaced relative to teeth 5A.

Adjacent rotor 4, and magnetically co-operating therewith, is a separately fixed magnetic transducer 6 in which is generated an alternating voltage when rotor 4 rotates relative thereto, the frequency of the generated voltage being a product of rotor speed and the number of teeth 4A.

Similarly, a magnetic transducer 7 co-operates with rotor 5 to also produce an alternating voltage. Since both rotors 4 and 5 have the same number of respective teeth 4A and 5A, the frequency of the generated voltage is identical in both transducers and, in a no-torque condition, the voltages are also in phase. When torque is being transmitted by member 2 whilst rotating, the angle of twist thereof results in angular displacement of rotor 4 relative to rotor 5 with a consequent shift in the phase of the voltage generated in transducer 6 relative to that of transducer 7. This phase shift is measured by a digital phasemeter 10 to which the transducers 6 and 7 are connected by electrical leads 8 and 9 respectively, the phasemeter 10 being provided with inputs X and Y respectively to receive the leads 8 and 9. Phasemeter 10 produces a readout in the form of a digital visual display 10A, which readout shows the phase-shift (and therefore torque) as a percentage of the maximum.

Figure 2:
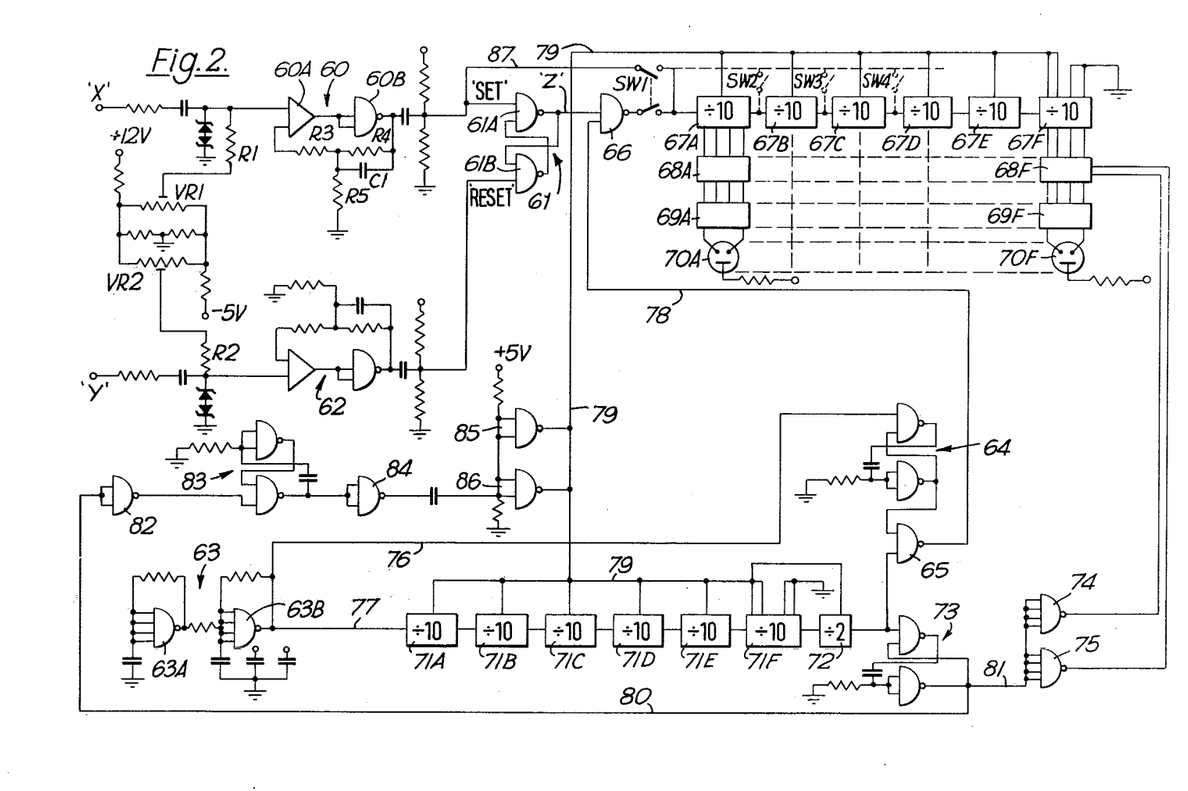
FIG. 2 is a circuit of a digital type phasemeter.

The circuit of FIG. 2 is of such a phasemeter 10 and comprises inputs X and Y, as before, which receive the input signals from the transducers. Input X leads to a trigger device 60 comprising a comparator 60A and a NAND gate 60B in series, the output of 60B being returned to the comparator input as positive feedback via network R3, R4, R5 and C1. The input to the Schmitt trigger is adjustably biased by means of a D.C. voltage picked off from variable resistor VR1 and led to the input via R1. By adjusting VR1, the input voltage which will trigger the circuit 60, to produce an output pulse, may be set to zero. The effect of the positive feedback via R3, R4, R5 and C1 is to suppress further triggering action for a predetermined length of time, thus preventing signal noise from falsely re-triggering the circuit 60. The output pulse from the trigger device leads to the "SET" input of a bistable 61A.

In similar manner, input Y leads to a trigger device 62 identical with trigger 60, the trigger point of which may be similarly varied and set to zero by means of VR2 connected to the input via R2. The output of trigger 62 leads to the "RESET" input of bistable 61B.

When inputs X and Y are in phase, the bistable 61A and bistable 61B produce no output, but as one input signal moves out of phase with the other, one bistable is switched to state 1 by the positive crossover of, say, input X, and then switched to the state 0 by the lagging positive crossover of input Y (or vice versa). The result is that the output of bistable 61A and bistable 61B has a Mark-Space ratio which is a measure of the phase difference.

In order to determine the Mark-Space ratio of the bistable 61A and bistable 61B output, a clock 63 is provided, comprising a 1MHz oscillator 63B, angle modulated by a multivibrator 63A, producing a train of clock pulses, which pulses pass via lead 76, monostable 64, NAND gate 65 (where they are inverted) and lead 78 to a NAND gate 66 thence to a series of six decade counters 67A to 67F inclusive. The bistable 61A and bistable 61B output also leads to gate 66 so that during every Mark-Space, re-inverted clock pulses pass to the counters 67A–67F.

The same train of clock pulses is also fed via lead 77 to a further series of six decade dividers 71A–71F where they are continuously counted until a count of $10^6$ is reached whereupon a binary divider 72 changes state from 0 to 1 and closes NAND gate 65 to further clock train pulses, via monostable 64, thus also stopping the count of the first series of counters 67A–67F. The output of binary divider 72 also leads to a monostable 73 which accordingly produces a pulse of predetermined duration which, via drivers 74 and 75, operates latches 68A–68F inclusive, which hold and present the count in BCD form to decoders 69A to 69F inclusive which in turn operate a visual display such as a series of indicators 70A–70F inclusive which may of the type known as NIXIE tubes. The pulse from monostable 73, also passes to drivers 85 and 86 via lead 80, inverter 82, a delay circuit 83 and a further inverter 84. The delayed pulse output of drivers 85 and 86 is fed into the reset line 79 of all the decade counters and all the dividers thus restoring them all to the zero state and causing the whole process to recommence.

The standard count-time is determined by the clock frequency ($10^6$Hz and the number of decade divider (6)), and in this example is one second.

The angle modulated clock, or warbling clock as it has been named, prevents errors in count which can occur when the input signal frequency coincides with a sub-multiple of the clock frequency.

Figure 3:
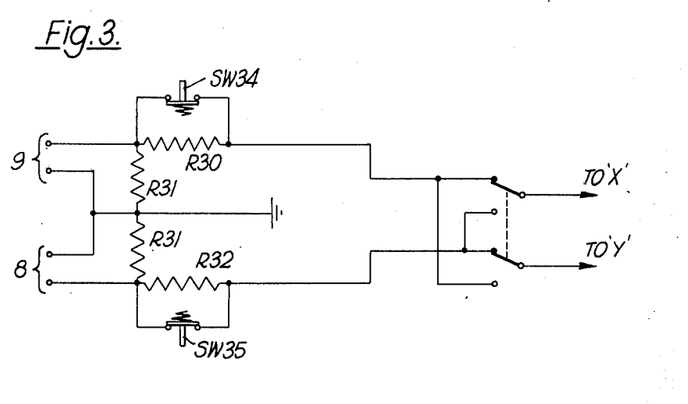
FIG. 3 illustrates a phasemeter input circuit whereby one or both input signals may be changed in amplitude, and whereby the signals may be reversed in connection.

Referring to FIG. 3, an additional input circuit to the phasemeter of FIG. 2, and which may be incorporated therein, is shown in which the amplitude of either input from transducer leads 8 and 9 respectively may be independently halved, or at least reduced, by means of push-switches SW34 and SW35 which, when depressed, allow resistors R30, R31 and/or R32, R33 respectively to attenuate the associated input signal. A further switch SW36 permits the input signals to be reversed prior to entering inputs X and Y of the phasemeter.

In practice, the phasemeter of FIG. 2 which incorporates the circuit of FIG. 3, would be set-up for operation by the following method which is an aspect of the invention: 1. With the torquemeter operating under steady torque conditions, first button SW34 is depressed and any change in readout observed. VR1 may then be adjusted to bring the readout back to its original value. Button SW34 is then released. The process is repeated until depression of button SW34 no longer produces any change in reading. 2. Button SW35 is then depressed, and VR2 appropriately adjusted. The button is then released. 3. The value of the readout is then noted and switch SW36 operated to reverse the inputs. The readout should now show the true complement of the noted value. Any deviation is then removed by adjustment of VR2. Repeated operation of SW36 will probably be required before true balance is achieved.

In a further aspect of the invention, the phasemeter of FIG. 2 may also be used to measure the input signal frequency which is, of course, proportional to the rotational speed of the torquemeter rotary components. Thus the phasemeter not only affords measurement of transmitted torque, but also that of transmitted power.

Referring again to FIG. 2, by operating SW1, the output of trigger 60 is fed directly to the input of decade counter 67A, gate 66 now being disconnected therefrom thus isolating the clock train of pulses from this series of counters. Further switches SW2, SW3, SW4 and so on, permit the count to be introduced at any point in the counter series. The display continues to be operated and counters 67A-67F cleared, as before described. Thus, the pulses from trigger 60 are counted directly over one second periods and accordingly displayed. played. For such measurement of input frequency it is preferable to employ a crystal controlled clock.

Figure 4:
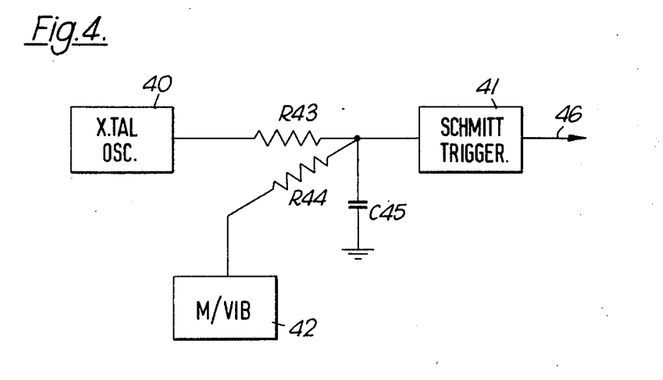
FIG. 4 is a circuit whereby angle modulation may be achieved.

FIG. 4 shows how such a crystal controlled clock may be angle modulated, which modulation may, if so desired, be switched off during frequency measurements. A crystal controlled oscillator 40 and a multivibrator 42 both feed into a trigger device 41, the output 46 of which is a train of clock pulses modulated by the action of the multivibrator 42 which causes the firing voltage of the trigger to vary.

Figure 5:
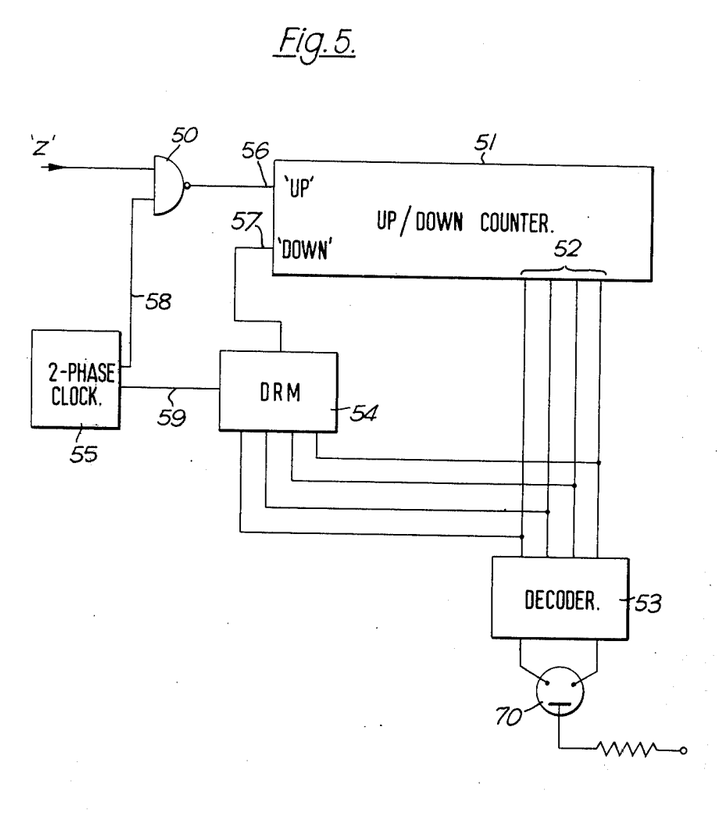
FIG. 5 shows an analogue type of phasemeter in basic schematic form.

Referring now to FIG. 5, a form of phasemeter having the response characteristics of a resistance capacity network, is illustrated in which the Mark-Space ratio of a bistable output is determined by a digital form of integration. An input circuit is provided identical with that illustrated in FIG. 2, comprising: inputs X, Y; Schmitt triggers 60 and 62 feeding into bistable 61A; and bistable 61B and, if so desired, also incorporating the features of FIG. 3.

Referring to FIG. 2, the output of bistable 61A and bistable 61B is annotated Z and this output may connect with an input of NAND gate 50 of FIG. 5. An output 58 of a two-phase clock 55 which provides two output trains of clock pulses, 180° out of phase with one another, connects with the other input of gate 50 so that, in operation, clock pulses are fed to the up input of an up-down counter 51 during each space period of the bistable output Z. Outputs 52 of the counter 57 lead to both a decoder 53 for display device 70, such as for example a NIXIE tube, and to a digital rate multiplier (a DRM) 54. Clock pulse from output 59 of the clock 55 are also fed to the DRM 54, the output of which leads to the down input of the counter 51.

The effect of this arrangement is that of an integrator, the output rising in value exponentially to a level determined by the Mark-Space ratio of the bistable output Z, much as would occur if a simple resistor/capacitor integrator were used, but having the advantage of direct and continuous digital output display.

In FIG. 5, only one set of ouputs 52, one decoder 53, and one display device 70 are illlustrated. A separate set of such outputs and components will be required for each significant digit displayed.

The technique of setting up such an analogue phasemeter may be as previously described in connection with the circuit of FIG. 2.

Figure 6:
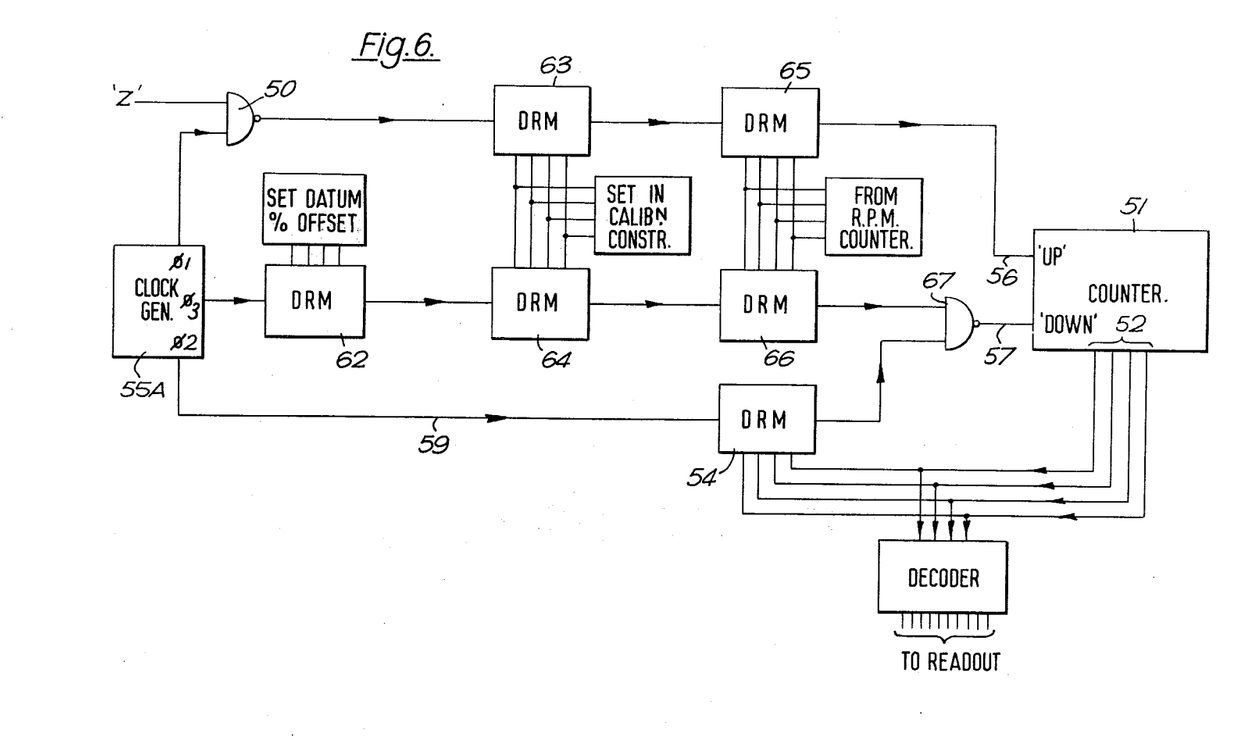
FIG. 6 illustrates a further development of the system shown by FIG. 5.

Referring now to FIG. 6, there is shown a development of the system shown by FIG. 5, whereby:

a. The reading due to any initial phase displacement may be offset, to give a no-load reading of zero.
b. Torque may be displayed in any desired engineering units, by setting in the appropriate calibration constant (generally defined as that torque which will twist the shaft through one tooth pitch) of the shaft for example by means of Bianary-to-BCD thumbwheel switches.
c. Torque in units of for example HP/RPM may be multiplied by a signal representing RPM to give a final display in H.P.

Function (a) may be accomplished by replacing the 2 phase clock 55 of FIG. 5 by a 3 phase clock 55A the third phase of which is fed into a Digital Rate Multiplier DRM 62, on which the required datum offset is set up by hand. The output from DRM 62 feeds into the down input of the up-down counter in parallel with the output from DRM 54, through OR-gate 67 during a period when the other two outputs from the 3 phase clock are inactive. If DRMs 63, 64, 65 and 66 are all set to act as straight-through connectors the effect is to reduce the displayed reading by the datum offset value set by hand into DRM 62.

Function (b) is accomplished by setting the required calibration constant i.e. the torque required to produce 360° phase displacement in the transducer on DRMs 63 and 64.

Function (c) is accomplished by setting two further DRMs 65 and 66 in response to a signal representing RPM. Provided the calibration constant set on DRMs 63 and 64 is in torque units of HP/RPM the final display will be in horse-power.

If DRM 64 is omitted, the datum offset set in to DRM 62 must be varied in proportion to the calibration constant set into DRM 63.

Yet a further aspect contemplated by the invention is an additional feature to the phasemeter of FIG. 2 whereby automatically adjustment of the firing voltages of Schmitt triggers 60 and 62 may be obtained. Briefly, a third series of decade counters may be provided in parallel with series 67A–67F, also fed via a gate with clock train pulses, the gate being controlled in such fashion by the bistable 61A and bistable 61B output that the complement of the count in series 67A–67F is obtained. Continuous electronic inspection of the two counts is made such that, when one count is no longer the complement of the other, a voltage is automatically applied to the input of either trigger 60 or trigger 62 according to and in proportion to the deviation.

Figure 7:
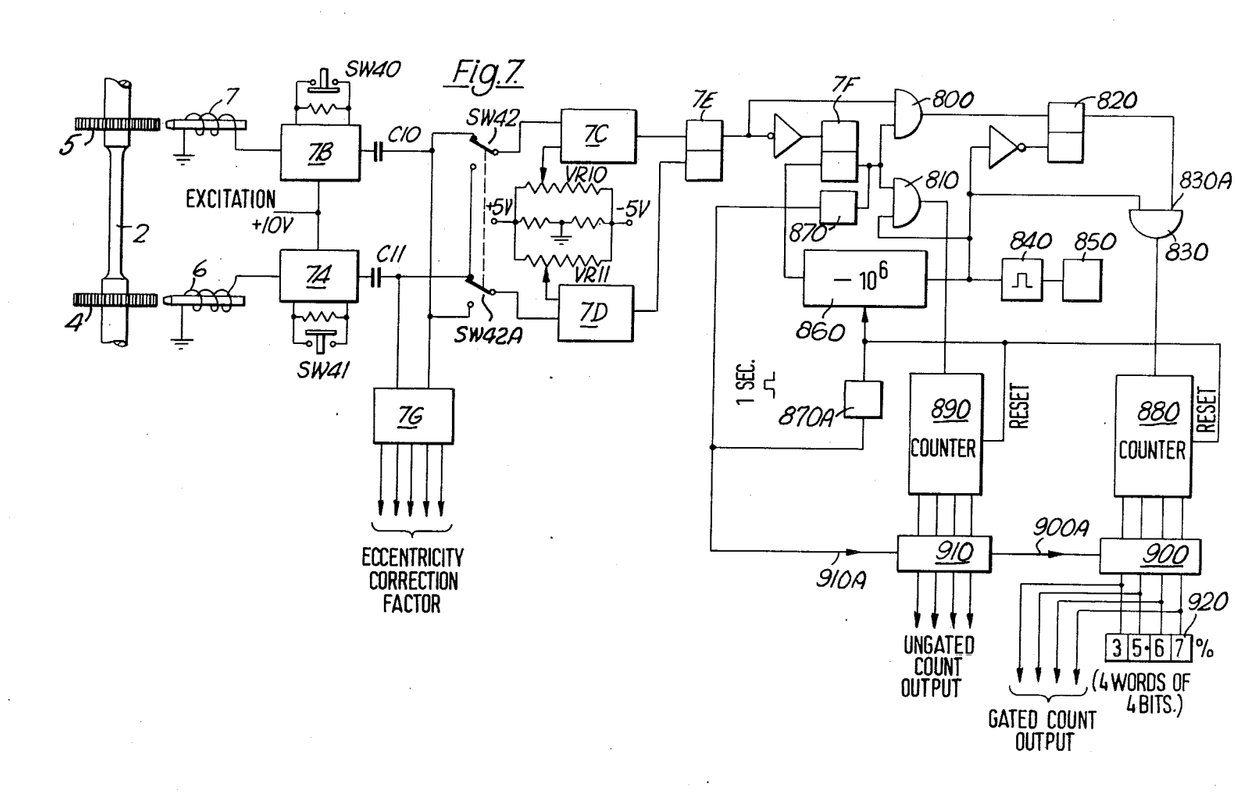
FIG. 7 shows in block diagram form a torquemeter incorporating a phasemeter of the type illustrated in FIG. 2 but including a logic circuit for extending the standard count-time.
Figure 7A:
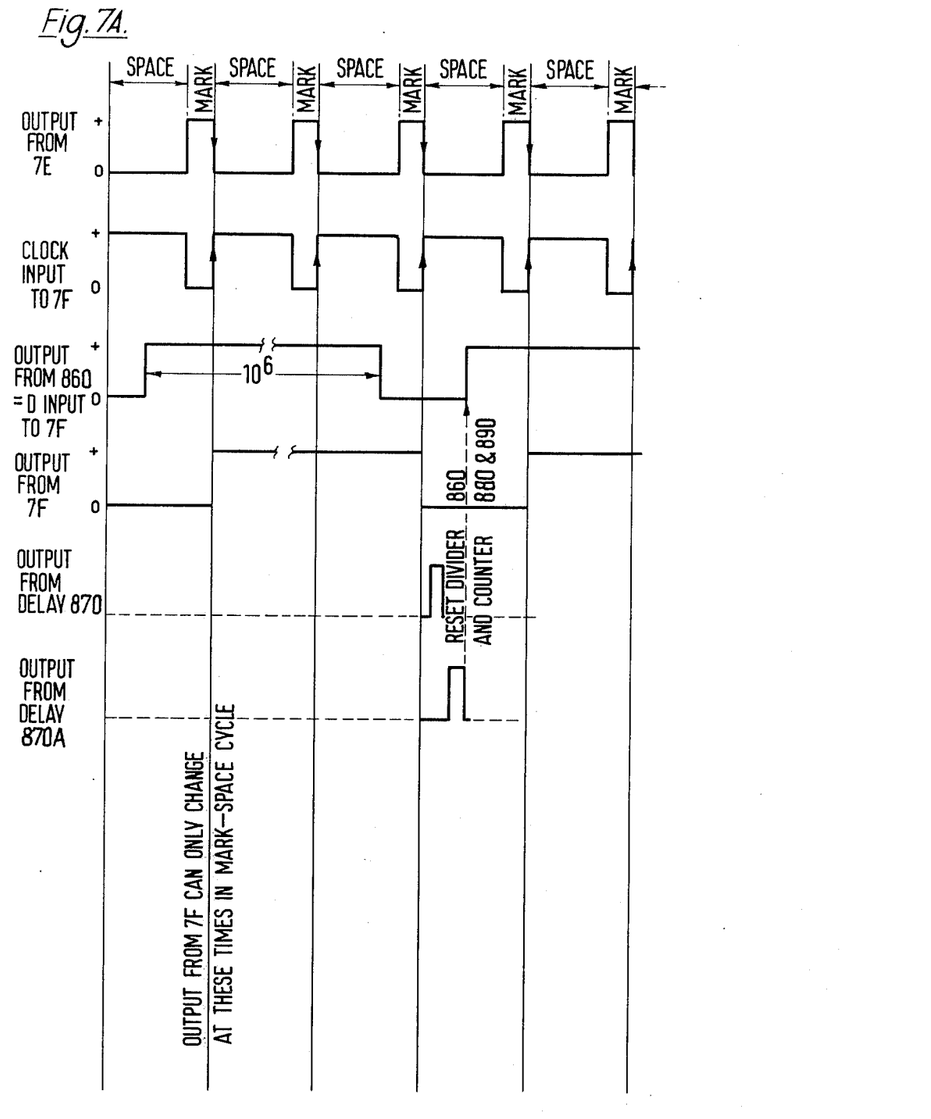
FIG. 7A shows a timing diagram of signals used in the circuit of FIG. 7.

The torquemeter illustrated in FIG. 7 comprises a pair of rotors 4 and 5 of the toothed wheel variety with associated electromagnetic transducers 6 and 7 both of which are magnetically excited by electric current from respective constant-current devices 7B and 7A. Switches SW40 and SW41 associated with devices 7B and 7A when operated, reduce the current outputs of the devices and correspondingly attenuate the signals from the transducers. The DC signals from each transducer are decoupled by respective capacitors C10 and C11 which permit only the AC component of each signal to pass. The signal from C10 passes to a trigger device 7C via commutating switch SW42, and that from C11 likewise passes through SW42A to trigger device 7D. VR10 provides adjustment of the set-point of trigger 7C and VR11 provides similar adjustment of trigger 7D. The outputs of the triggers 7C and 7D pass to a bistable device 7E, the output of which, in operation, is a square wave the Mark-Space ratio of which is a measure of the phase difference between the respective transducer signals.

A clock generator 840, angle modulated by a multivibrator 850 continuously sends clock pulses to AND gates 810 and 830 and to bistable 820 and also to a $10^6$ divider 860 which changes state from a low level output to a high level output on receiving a 'Clear' signal via delays 870 and 870A. It then maintains said high level state for $10^6$ clock pulses upon which it reverts to the low level output state until again activated by a further Clear signal.

AND gate 830 permits clock pulses to pass to a counter 880 each time input 830A is receiving a "Mark" from the bistable 7E via a logic circuit comprising D-type flip-flop 7F, AND gate 800 and the bistable 820; the flip-flop 7F receiving the output of the divider at the data input of the flip-flop and the inverted output of bistable 7E at the clock input of the flip-flop; and AND gate 810 operates during the same intervals as gate 800, to pass clock pulses to a second counter 890; i.e. it counts during the standard time plus any extension thereof.

The output from D-type flip-flip 7F follows the D-input to it from divider 860 only at the moment when the inverted clock input to the flip-flop 7F changes from low level to high level at the end of a 'Mark' period.

Delays 870 and 870A are activated when the output from 7F assumes low level. The first delay 870 provides a strobe signal to transfer the contents 880 and 890 to their respective latches 900 and 910, and then the second delay 870A provides said 'Clear' signal to reset counters 880 and 890 and the divider 860.

The output iron divider 860 then changes to its high level state and this is repeated at the output of flip-flop 7F when the rising voltage edge of the inverted input thereto, denoting the end of the next Mark period, reaches the clock input of flip-flop 7F.

Thus both counters always start counting at the end of a Mark period; and continue to count after the divider output reverts to its low level state until the rising voltage edge of said inverted input to flip-flop 7F, denoting the end of the next Mark period, causes the output of the flip-flop to assume the state existing at its data input from divider 860.

The overall object and effect is to extend the nominal count period over an integral number of Mark-Space periods during which both gated and ungated pulses are counted. The former divided by the latter provides an error-free measure of the Mark-Space ratio and of the signal phase displacement which it represents.

Latch 900 is connected to a visual display unit 920 which shows an uncorrected measure of phase displacement of the two transducer signals, the display changing each time the latch 900 is relatched.

The ungated count in latch 910 at any one time, may be applied as a dividing factor to the gated count to provide a quotient which is the Mark-Space ratio and thus, a measure of the phase displacement between the two harmonic transducer signals.

In order to obtain a further correction factor for errors introduced by eccentricity of the rotors 4 and 5 relative to transducers 7 and/or 6, a comparator 7G receives the signals from both transducers, compares the amplitude of one relative to the other and produces a signal relative thereto and which may be used to adjust the final dispaly.

Figure 8:
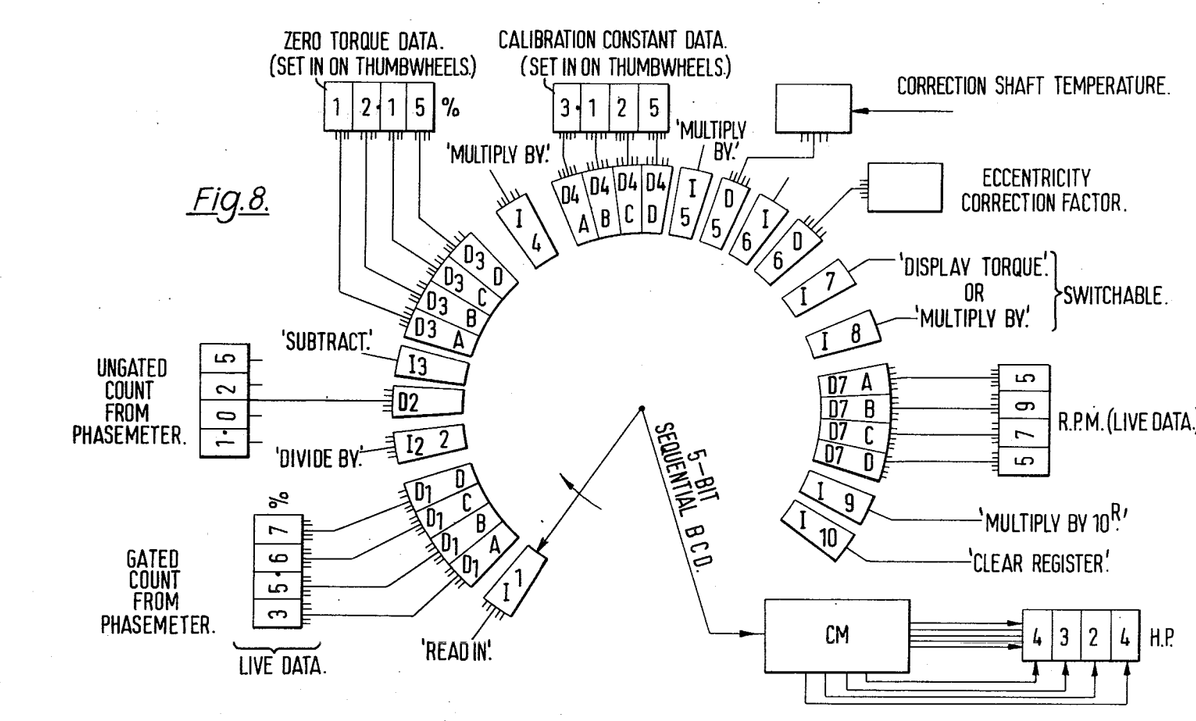
FIG. 8 illustrates an electronic scanner and calculator module for incorporation in the phasemeter of FIG. 7.

In order to conveniently apply these and other correction factors (such as, for example, variations in Young's Modulus of the torsional member 2 with change in shaft temperature, or calibration constants, etc.) an electronic calculator may be used. Referring now to FIG. 8, such a system is outlined whereby such corrections may be made at the same time permitting direct display of torque or horsepower. This system uses an L.S.1. Calculator module CM as shown on FIG. 8 broadly similar in principle to those used in pocket electronic calculators and known colloquially as the "Number Cruncher" data and instructions are fed into it through a common channel in the form of 5 bit words of sequential binary form. In the case of data the first bit is always zero; and for instructions the first bit is always a one (1).

FIG. 8 also shows schematically how a sequence of instructions and live data may be fed into the calculator module, in the correct sequence to provide a final reading of torque in engineering units or of power in HP or kilowatts as may be desired. In practice some of the instructions will be permanently hard-wired while others will be in the nature of constants such as zero torque datum off-set and calibration constant which are set in by hand on thumb wheel switches the output from which is normally in the form of parallel B.C.D. There is also scope for introducing small correction factors presented in B.C.D. and it is quite permissible to derive such corrections by analog means if they are small.

Scanning, which is electronic, converts the data and instructions from parallel to sequential B.C.D.

With such a system there is virtually no limit to the number of steps of instructions followed by data which may be included in the complete cycle. Thus instruction 1.5 introduces an empirical correction D.5. (in the order of 1 or 2%) for the effect of temperature on the elastic modulus of the shaft. D.5. in this case is made responsive to the measured temperature of the shaft environment as measured by a thermocouple or radiation pyrometer; in comparison with the known ambient temperature at which the shaft calibration constant was determined.

A method for automatic correction of errors or drift of trigger settings is to electronically or otherwise commutate the inputs X and Y say for one second in every 10 seconds as an example, so that the complement of the count is obtained during each such one second period at the outputs of the decoders 69A–69F, FIG. 2. Again, electronic inspection of the complement is made with ensuing automatic adjustment of the trigger 60 and trigger 62.

We claim:

1. A phasemeter for determining the relative angular displacement of two harmonic signal waves derived from transducers, comprising: two trigger devices each for receiving a respective said signal wave and which produce an output pulse each time the respective signal wave passes through a reference level in at least one sense of direction; trigger adjustment means for setting the level at which each said device triggers; a bistable which in operation has first and second stable output states and which receives the output of each said trigger device in such manner that it produces a square wave output the Mark-Space ratio of which is directly related to the relative angular displacement of said two harmonic signal waves; measuring apparatus which receives said bistable square wave output, measures the Mark-Space ratio thereof and produces an output indicative of said relative angular displacement; in which further means are provided for determining each said trigger device set-point comprising, attenuator means for selectively and respectively attenuating said signal waves, and switch means for reversing the inputs to said trigger devices.

2. A phasemeter as claimed in claim 1 which the measuring apparatus is digital and comprises: a generator of continuous high frequency clock pulses; a first counter; a gate controlled by said bistable output so that said clock pulses are passed to said first counter only when said bistable output assumes a first state; a divider which receives directly said clock pulses and produces an output pulse each time the number of received clock pulses reaches a predetermined number, thus determining a standard countperiod; output means which operate to indicate the total count of said first counter each time said divider produces an output pulse, delay means which receive and delay said divider output pulse which is then directed thereby to rest said first counter and said divider.

3. A phasemeter according to claim 2 in which means are provided for frequency modulating the output from said generator of clock pulses.

4. A phasemeter as claimed in claim 3, in which the clock pulse generator comprises a crystal controlled oscillator, a multi-vibrator and a trigger device; the output of the oscillator and the multivibrator being commoned to drive the trigger device to provide a modulated output therefrom.

5. A phasemeter according to claim 1, in which the measuring apparatus is digital and includes: a clock pulse generator; a logic circuit providing a countperiod comprising an integral number of Mark-Space periods; a first counter which counts clock pulses gated to pass only during the mark states of the count period; and a second counter which counts the total number of clock pulses generated during the said count period; the ratio of said counts being a measure of the Mark-Space ratio and of the phase displacement which it represents.

6. A phasemeter according to claim 5, comprising a calculator which is fed the totals of both said counters, and which divides the count of the first counter by the count of the second counter to provide a measure of said signal wave displacement.

7. A phasemeter according to claim 6, in which said calculator comprises: one or more data input means; one or more instruction input means; a scanner which periodically scans said data input means; said instruction input means and said first and second counter outputs, in a predetermined sequence; a calculator module which receives the sequence of data and instruction and performs calculation in accordance with said instructions; and output means which present the calculation results.

8. A phasemeter as claimed in claim 5, wherein said measuring apparatus includes a divider which receives, directly, clock pulses from said clock pulse generator and produces an output pulse at the end of a predetermined count of clock pulses.

9. A phasemeter according to claim 8, wherein said logic circuit comprises:
a flip-flop having a data input and a clock input, an inverter having the input thereof connected to the output of said bistable and the output thereof connected to the clock input of the flip-flop; the data input of the flip-flop being connected to the output of the divider,
a first logic gate having an output connected to said first counter, a first input connected to the output of said bistable and a second input connected to the output of said flip-flop, and
a second logic gate having an output connected to said second counter, a first input connected to the output of the clock pulse generator and a second input connected to the output of said flip-flop; acting to maintain an enabling signal to both said first and second logic gates to cause them to permit gating of clock pulses to said first and second counters until the divider stops counting and until the end of the mark signal in the mark/space period current when the mark signal in the mark/space period current when the divider stopped counting, whereby the first and second counters are operated to effect their respective counts over an integral number of mark/space periods even though the divider stops counting before the mark/space period then current terminates.

10. A phasemeter as claimed in claim 8 in which said logic circuit comprises a biased electronic switch, the output of which controls gating of clock pulses to said first and second counters; the switch receiving at its bias input, the output of said bistable, and at a signal input, the output of said divider, so that, for as long as said divider is counting during a count period, the output of the switch permits gating of clock pulses to said first counter in response to mark signals from said bistable and to said second counter throughout each mark space period occurring during the counting of the divider, and so that, when the divider terminates its count, the switch continues to produce the same output until the temination of the mark signal of the mark space period current at the time the divider stopped counting, whereby the phasemeter in each count period operates over an integral number of mark space periods.

11. A phasemeter according to claim 10, further comprising:
   a bistable device one input of which is connected to the output of said first logic gate;
   an inverter the input of which is connected to the output of said clock generator, and the output of which is connected to a second input of said bistable device; and
   a third logic gate having an input connected to the output of said bistable device, a second input connected to the output of said clock generator and an output connected to the input of said first counter; whereby said third logic gate gates pulses to said first counter during the occurrence of mark signals in each mark/space period.

12. A torquemeter comprising: an axial, rotatable, torsional member for transmitting rotational power and having two ends; two toothed-wheel members each rigidly attached to a respective end of said torsional member; two transducers in fixed relative angular relationship each associated with a respective toothed-wheel member so as to produce a harmonic signal wave when said torsional member rotates, and a phasemeter according to claim 10 to which the transducers connect.

13. A torquemeter according to claim 2, in which is provided a comparator whereby the amplitudes of said harmonic signal waves are compared thus producing a corrective signal directly related to the difference therebetween; means for receiving the corrective signal and applying a correction to the phasemeter output.

14. A torquemeter according to claim 25, in which the transducers are electrically excited and said attenuator means of the phasemeter comprise means for reducing the excitation current of either said transducers.

15. A torquemeter having a rotatable torsional member and including a phasemeter according to claim 14 in which is included a bypass switch whereby said bistable may be bypassed so that said first counter receives un-gated clock pulses and therefore indicates rotational speed of said torsional member.

16. A phasemeter according to claim 1, in which the measuring apparatus is an integrator of said bistable output.

17. A phasemeter according to claim 16, in which the integrator comprises: a two-phase generator of clock pulses, having first and second outputs; a gate controlled by said bistable output and to which connects the generator first output so that clock pulses pass through the gate each time the bistable output assumes a first state; an up-down counter, the up input of which receives the gated clock pulses; a digital rate meter through which clock pulses from the generator second output pass to the down input of said up-down counter, and the input of which connects to the output of said up-down counter; display means for displaying the output of said up-down counter.

18. A phasemeter according to claim 16, in which the integrator comprises: a three phase generator of clock pulses having first, second and third outputs; a gate controlled by said bistable output and to which connects said generator first output so that clock pulses pass through the gate whenever said bistable output assumes a first state; an up-down counter having up and down respective inputs and an output; a first digital ratemeter the input of which is connected to said up-down counter output, and to said second output of the generator; an OR-gate having two inputs and an output, one input of which is connected to said first digital ratemeter output, and the output of which is connected to said first digital ratemeter output, and the output of which is connected to the down input of said up-down counter; one or more second digital ratemeters in series connected between said gate and said up input of said up-down counter; one or more third digital ratemeters in series connected between said generator third and the other OR-gate input; means for applying digitally coded information to the inputs of said second and third digital ratemeters thereby to directly modify the up-down counter output; means for displaying the output of said up-down counter.

19. A phasemeter as claimed in claim 1, in which said trigger devices are each constituted by a Schmitt trigger device.

20. A phasemeter as claimed in claim 1 in which said bistable is constituted by a flip-flop.

* * * * *